United States Patent
Mazotta (10) Patent No.: US 11,108,379 B2
(45) Date of Patent: Aug. 31, 2021

(54) HIGH ISOLATION SURFACE ACOUSTIC WAVE DUPLEXER

(71) Applicant: Resonant Inc., Goleta, CA (US)

(72) Inventor: John Mazotta, Oakland, CA (US)

(73) Assignee: Resonant Inc., Austin, TX (US)

(*) Notice: Subject to any disclaimer, the term of this patent is extended or adjusted under 35 U.S.C. 154(b) by 61 days.

(21) Appl. No.: 16/280,820

(22) Filed: Feb. 20, 2019

(65) Prior Publication Data

US 2020/0076406 A1 Mar. 5, 2020

Related U.S. Application Data

(60) Provisional application No. 62/727,386, filed on Sep. 5, 2018.

(51) Int. Cl.
*H03H 9/72* (2006.01)
*H03H 9/54* (2006.01)
*H03H 9/64* (2006.01)

(52) U.S. Cl.
CPC .......... *H03H 9/725* (2013.01); *H03H 9/542* (2013.01); *H03H 9/64* (2013.01); *H03H 9/6483* (2013.01)

(58) Field of Classification Search
CPC ........ H03H 9/542; H03H 9/6483; H03H 9/64; H03H 9/725
USPC .......................................................... 333/133
See application file for complete search history.

(56) References Cited

U.S. PATENT DOCUMENTS

| | | | |
|---|---|---|---|
| 6,404,303 B1* | 6/2002 | Kuroda | H03H 9/0542 333/193 |
| 9,608,595 B1 | 3/2017 | Raihn et al. | |
| 2006/0267708 A1* | 11/2006 | Matsuda | H03H 9/706 333/133 |
| 2010/0225418 A1* | 9/2010 | Kawamoto | H03H 9/725 333/133 |
| 2010/0244979 A1* | 9/2010 | Matsuda | H03H 9/0571 333/100 |
| 2011/0018654 A1 | 1/2011 | Bradley et al. | |
| 2011/0254639 A1* | 10/2011 | Tsutsumi | H03H 9/70 333/132 |

(Continued)

FOREIGN PATENT DOCUMENTS

JP 09-321573 A * 12/1997
JP 2002-299997 A * 10/2002

(Continued)

OTHER PUBLICATIONS

English language machine translation of JP 2010-192974 A, published Sep. 2, 2010, 18 pages. (Year: 2010).*

(Continued)

*Primary Examiner* — Barbara Summons
(74) *Attorney, Agent, or Firm* — SoCal IP Law Group LLP; John E. Gunther (57) ABSTRACT

A duplexer includes a surface acoustic wave (SAW) device comprising a transmit filter and a receive filter formed on a piezoelectric substrate. The transmit filter includes a first transmit shunt resonator connected to a first transmit-filter ground terminal. The receive filter includes a first receive shunt resonator connected to a first receive-filter ground terminal. A ground coupling capacitor is connected between the first transmit-filter ground terminal and the first receive-filter ground terminal.

11 Claims, 7 Drawing Sheets

(56) References Cited

U.S. PATENT DOCUMENTS

| | | | |
|---|---|---|---|
| 2012/0313724 A1* | 12/2012 | Tsurunari | H03H 9/725 |
| | | | 333/133 |
| 2013/0307639 A1* | 11/2013 | Mori | H03H 9/54 |
| | | | 333/133 |
| 2016/0173062 A1* | 6/2016 | Takamine | H03H 9/6479 |
| | | | 333/133 |
| 2018/0062615 A1 | 3/2018 | Kato et al. | |

FOREIGN PATENT DOCUMENTS

| | | | |
|---|---|---|---|
| JP | 2009-225198 A | * | 10/2009 |
| JP | 2010-192974 A | * | 9/2010 |
| JP | 2015-037272 A | * | 2/2015 |

OTHER PUBLICATIONS

English language machine translation of JP 09-321573 A, published Dec. 12, 1997, 9 pages. (Year: 1997).*
English language machine translation of JP 2009-225198 A, published Oct. 1, 2009, 18 pages. (Year: 2009).*
English language machine translation of JP 2015-037272 A, published Feb. 23, 2015, 11 pages. (Year: 2015).*

\* cited by examiner

HIGH ISOLATION SURFACE ACOUSTIC WAVE DUPLEXER

RELATED APPLICATION INFORMATION

This application claims priority from Provisional Patent Application No. 62/727,386, filed Sep. 5, 2018, titled HIGH ISOLATION SURFACE ACOUSTIC WAVE DUPLEXER, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using surface acoustic wave (SAW) resonators, and specifically to filters and duplexers incorporating SAW resonators to provide very high rejection or isolation in a predetermined frequency band.

Description of the Related Art

A radio frequency (RF) filter is a two-terminal device configured to pass some frequencies and to stop other frequencies, where "pass" means transmit with relatively low insertion loss and "stop" means block or substantially attenuate. The range of frequencies passed by a filter is referred to as the "passband" of the filter. The range of frequencies stopped by such a filter is referred to as the "stopband" of the filter. A typical RF filter has at least one passband and at least one stopband. Specific requirements on a passband or stopband depend on the specific application. For example, a "passband" may be defined as a frequency range where the insertion loss of a filter is less than a defined value such as one dB, two dB, or three dB. A "stopband" may be defined as a frequency range where the insertion loss of a filter is greater than a defined value such as twenty dB, twenty-five dB, forty dB, or greater depending on application. A "multiple-passband" filter is a filter that provides multiple noncontiguous passbands separated by stopbands. For example, a dual-passband filter has two disjoint frequency ranges with low insertion loss separated by a stopband having high insertion loss.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Surface acoustic wave (SAW) resonators are used in a variety of RF filters including band-reject filters, band-pass filters, duplexers, and multiplexers. A duplexer is a radio frequency filter device that allows simultaneous transmission in a first frequency band and reception in a second frequency band (different from the first frequency band) using a common antenna. A multiplexer is a radio frequency filter with more than two input or output ports with multiple passbands. A triplexer is a four-port multiplexer with three passbands.

RF filters typically require many design trade-offs to achieve, for each specific application, the best compromise between such performance parameters as insertion loss, rejection, isolation, power handling, linearity, size and cost. Specific design and manufacturing methods and enhancements can benefit simultaneously from one or several of these requirements.

Throughout this description, elements appearing in figures are assigned three-digit reference designators, where the most significant digit is the figure number where the element is introduced, and the two least significant digits are specific to the element. An element that is not described in conjunction with a figure may be presumed to have the same characteristics and function as a previously-described element having the same reference designator.

DETAILED DESCRIPTION

Figure 1:
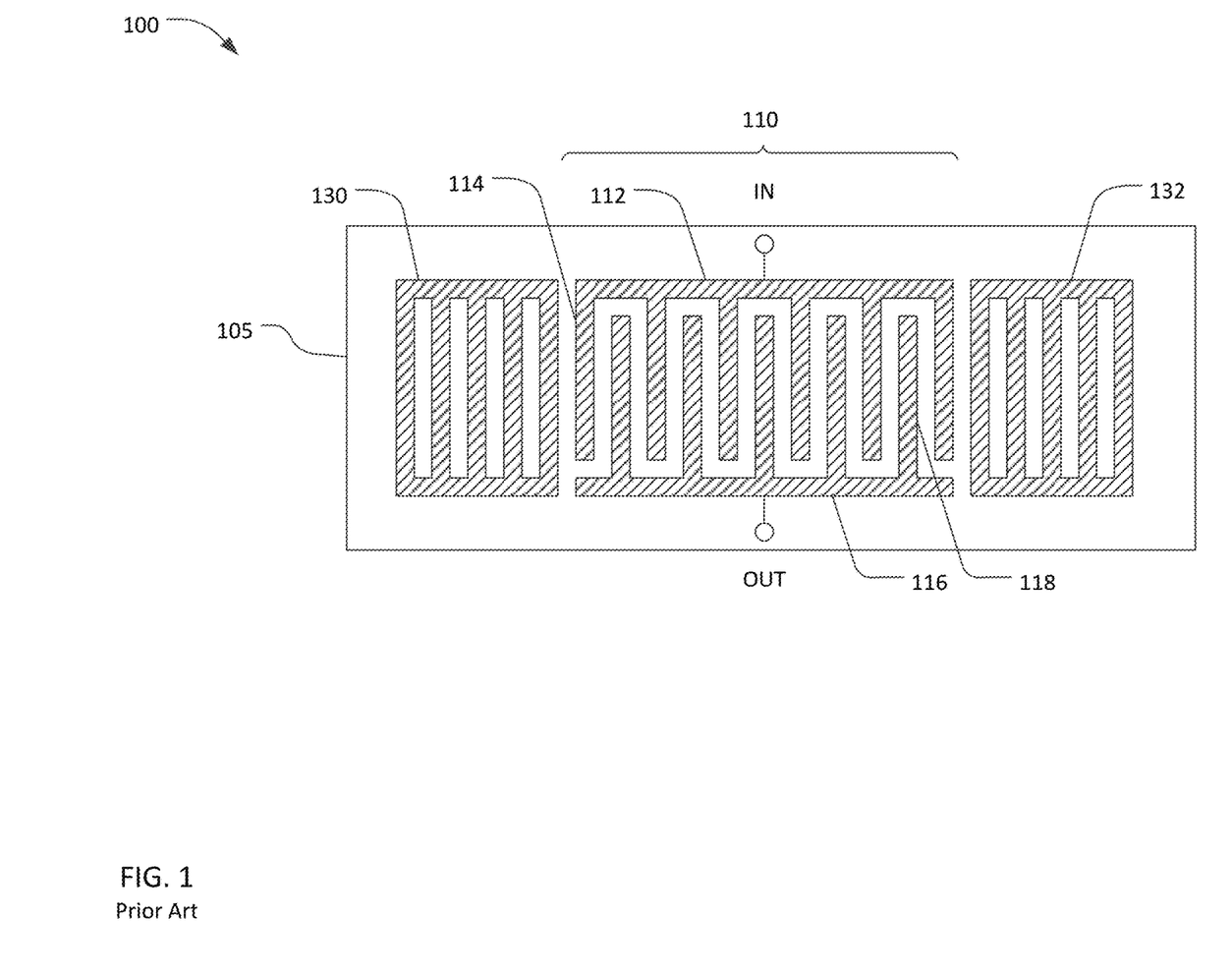
FIG. 1 is a schematic plan view of a SAW resonator.

As shown in FIG. 1, a SAW resonator 100 may be formed by thin film conductor patterns formed on a surface of a piezoelectric substrate 105. The term "piezoelectric substrate" means a substrate where at least one surface is a piezoelectric material such as quartz, lithium niobate, lithium tantalate, or lanthanum gallium silicate. A piezoelectric substrate may be, for example, a single-crystal slab of the piezoelectric material, or a layer or film of the piezoelectric material attached to, or formed on, a substrate comprising one or more other materials. The thin conductor patterns may be formed from aluminum, copper, alloys of aluminum or copper, gold, or any other suitable conductive material. The thin film conductor patterns include an interdigital transducer (IDT) 110 and may include grating reflectors 130, 132.

The IDT 110 includes a first plurality of parallel conductors, such as conductor 114, interleaved with a second plurality of parallel conductors, such a conductor 118. The first plurality of parallel conductors connects to and extends from a first bus bar 112. The second plurality of parallel conductors connects to and extends from a second bus bar 116. The first and second bus bars 112, 116 serve as the input and output terminals of the resonator 100, respectively. A radio frequency or microwave signal applied across the IDT 110 can generate an acoustic wave on the surface of the substrate 105. As the SAW resonator 100 is shown in FIG. 1, the surface acoustic wave will propagate in the left-right direction.

The grating reflectors 130, 132 each include a plurality of parallel conductors configured to reflect the acoustic wave propagating across the substrate to confine most or all of the acoustic energy to the area of the substrate occupied by the IDT 110.

The coupling between an RF or microwave signal applied to the resonator 100 and the surface acoustic wave is highly frequency-dependent, which, in turn, makes the impedance or admittance between the input and output of the resonator 100 highly frequency dependent. The admittance between the input and output of a SAW resonator, such as the resonator 100, typically exhibits both a resonance (where the admittance between the input and output is very high) and an anti-resonance (where the admittance between the input and output approaches zero). The frequencies of the resonance and the anti-resonance are determined primarily by the pitch and orientation of the conductors of the IDT, the choice of substrate material, and the crystallographic orientation of the substrate material.

Figure 2:
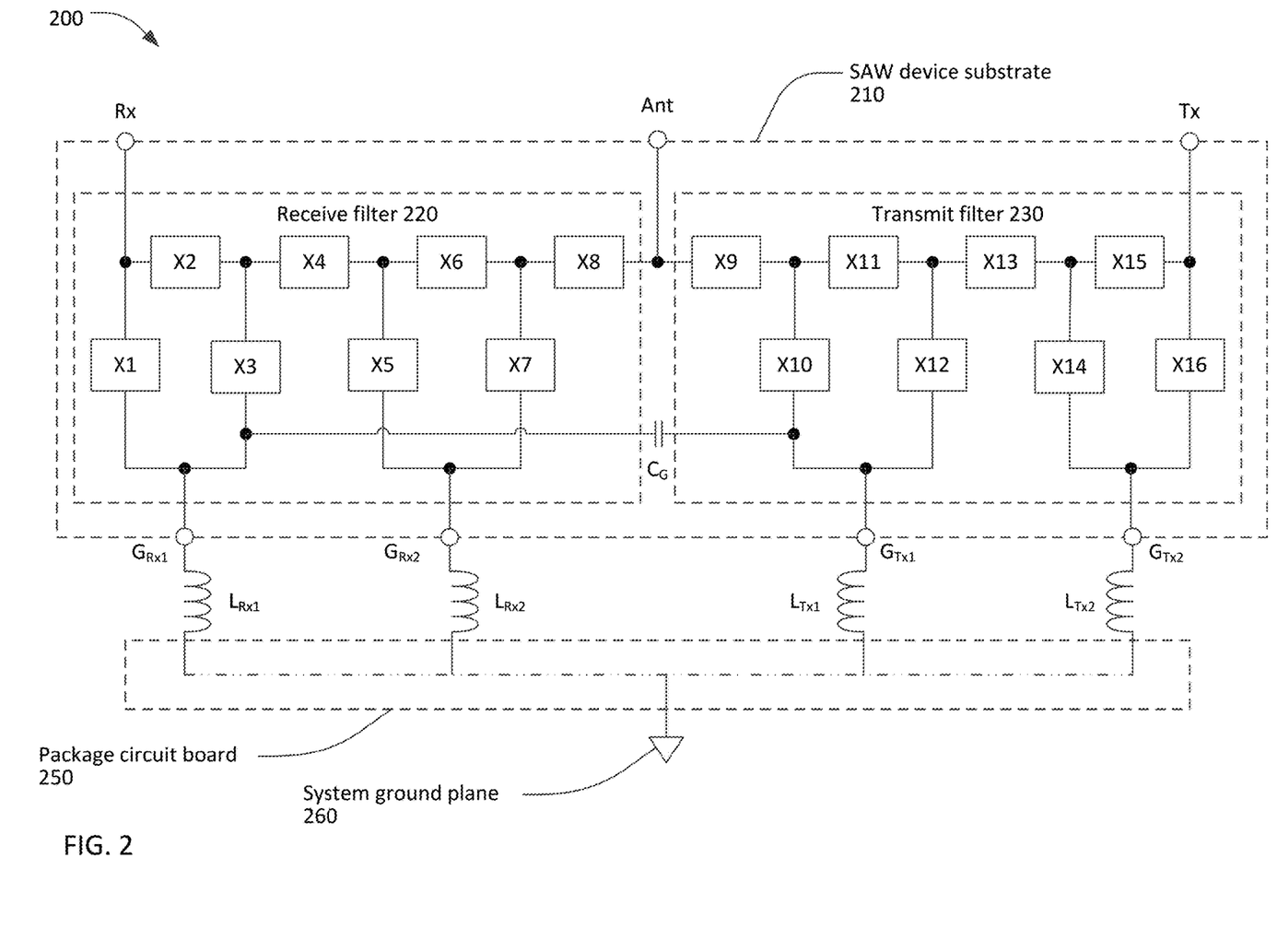
FIG. 2 is a schematic circuit diagram of a duplexer device incorporating multiple SAW resonators.

Filter circuits commonly incorporate more than one SAW resonator. For example, FIG. 2 shows a schematic diagram of an LTE (long term evolution) Band 1 duplexer filter circuit 200 incorporating sixteen SAW resonators, labeled X1 through X16. Each of the resonators X1 to X16 may be comprised of an inter-digital transducer and grating reflectors as shown in FIG. 1. The use of sixteen SAW resonators is exemplary and a duplexer or other filter circuit may include more or fewer than sixteen SAW resonators.

The duplexer filter circuit 200 includes a transmit filter 230 and a receive filter 220, each of which include eight SAW resonators. The use of eight SAW resonators in each of the transmit and receive filters is exemplary. Either or both of the transmit filter and the receive filter may have more or fewer than eight resonators. The number of resonators in the transmit and receive filters of a duplexer need not be equal.

The transmit filter 230 has an input connected to a transmitter (Tx) terminal and an output connected to an antenna (Ant) terminal of the duplexer 200. The transmit filter 230 is configured to pass signals within a transmit frequency band from a transmitter connected to the Tx terminal to an antenna connected to the Ant terminal. The receive filter 220 has an input connected to the Ant terminal and an output connected to a receiver (Rx) terminal of the duplexer 200. The receive filter 220 is configured to pass signals within a receive frequency band from the antenna to a receiver connected to the Rx terminal. An important function of a duplexer is to provide high isolation (i.e. very low transmittance) between the Tx terminal and the Rx terminal, particularly for the transmit frequency band and/or the receive frequency band.

In the duplexer filter circuit 200, SAW resonators X2, X4, X6, X8, X9, X11, X13, and X15 may be referred to as "series resonators" since these eight SAW resonators are connected in series between the Rx and Tx terminals of the filter circuit. SAW resonators X1, X3, X5, X7, X10, X12, X14, and X16 may be referred to as "shunt resonators" since these four SAW resonators are each connected from either a node between two series resonators or one of the signal terminals (Tx, Rx, or Ant) and one of several ground terminals ($G_{Rx1}$, $G_{Rx2}$, $G_{Tx1}$, $G_{Tx2}$) on the SAW device substrate 210 (and thus "shunt" some radio frequency energy towards ground). In this example, there are two receive-filter ground terminals $G_{Rx1}$, $G_{Rx2}$ and two transmit-filter ground terminals $G_{Tx1}$, $G_{Tx2}$. Shunt resonators X1 and X3 connect to a first receive-filter ground terminal $G_{Rx1}$, and shunt resonators X5 and X7 connect to a second receive-filter ground terminal $G_{Rx2}$. Similarly, shunt resonators X10 and X12 connect to a first transmit-filter ground terminal $G_{Tx1}$, and shunt resonators X14 and X16 connect to a second transmit-filter ground terminal $G_{Tx2}$.

However, the ground terminals ($G_{Rx1}$, $G_{Rx2}$, $G_{Tx1}$, $G_{Tx2}$) on the SAW device substrate 210 are not truly "ground" (i.e. held at zero volts). These ground terminals interconnect, typically by means of a solder bump, with a corresponding ground conductor on a package circuit board 250 within the filter package. The ground conductors on the package circuit board 250 then interconnect with a system ground plane 260 external to the filter package. At the frequency of operation of the duplexer 200 (1.92 GHz to 2.17 GHz), the interconnections and circuit board conductors are not insignificant elements. In particular, the interconnections and conductors are primarily inductive at the frequency of operation and are represented in FIG. 2 by ground inductors $L_{Rx1}$, $L_{Rx2}$, $L_{Tx1}$, $L_{Tx2}$. Each ground terminal $G_{Rx1}$, $G_{Rx2}$, $G_{Tx1}$, $G_{Tx2}$ is effectively connected to the system ground plane 260 through a respective ground inductor.

The interconnections and circuit traces between the SAW device substrate 210 and the system external to the duplexer 200 also add inductors in series with the Rx, Ant, and Tx terminals of the duplexer. These inductors (not shown in FIG. 2) are less significant than the ground inductors $L_{Rx1}$, $L_{Rx2}$, $L_{Tx1}$, $L_{Tx2}$ and not relevant to the subject matter of this patent.

The radio frequency (RF) current flowing through the shunt resonators and the ground inductors $L_{Rx1}$, $L_{Rx2}$, $L_{Tx1}$, $L_{Tx2}$ results in a small RF voltage at each ground terminal $G_{Rx1}$, $G_{Rx2}$, $G_{Tx1}$, $G_{Tx2}$. In at least some duplexers, an improvement in isolation between the Rx terminal and the Tx terminal can be obtained, for at least a range of frequencies, by connecting a capacitor between one of the receive-side ground terminals and one of the transmit-side ground terminals. In the example of FIG. 2, a ground coupling capacitor CG is connected between the first receive-filter ground terminal $G_{Rx1}$ and the first transmit-filter ground terminal $G_{Tx1}$. The capacitance of the ground coupling capacitor CG is configured to enhance isolation between the Rx and Tx terminals over at least a portion of the receive frequency band and/or the transmit frequency band.

The duplexer 200 of FIG. 2 is exemplary. A duplexer may have at least one ground terminal for each of a receive filter and a transmit filter. A duplexer may have more than two ground terminals for either or both of the receive filter and the transmit filter. One, two, or more shunt resonators may connect to each ground terminal. Typically, all shunt resonators of the receive filter connect to respective receive-filter ground terminals, and all shunt resonators of the transmit filter connect to respective transmit-filter ground terminals. Typically, all ground terminals are isolated from each other on the SAW device substrate. A ground coupling capacitor may be connected between any one of the receive-filter ground terminals and any one of the transmit-filter ground terminals. Multiple ground coupling capacitors may be connected between pairs of receive-filter and transmit-filter ground terminals.

Figure 3:
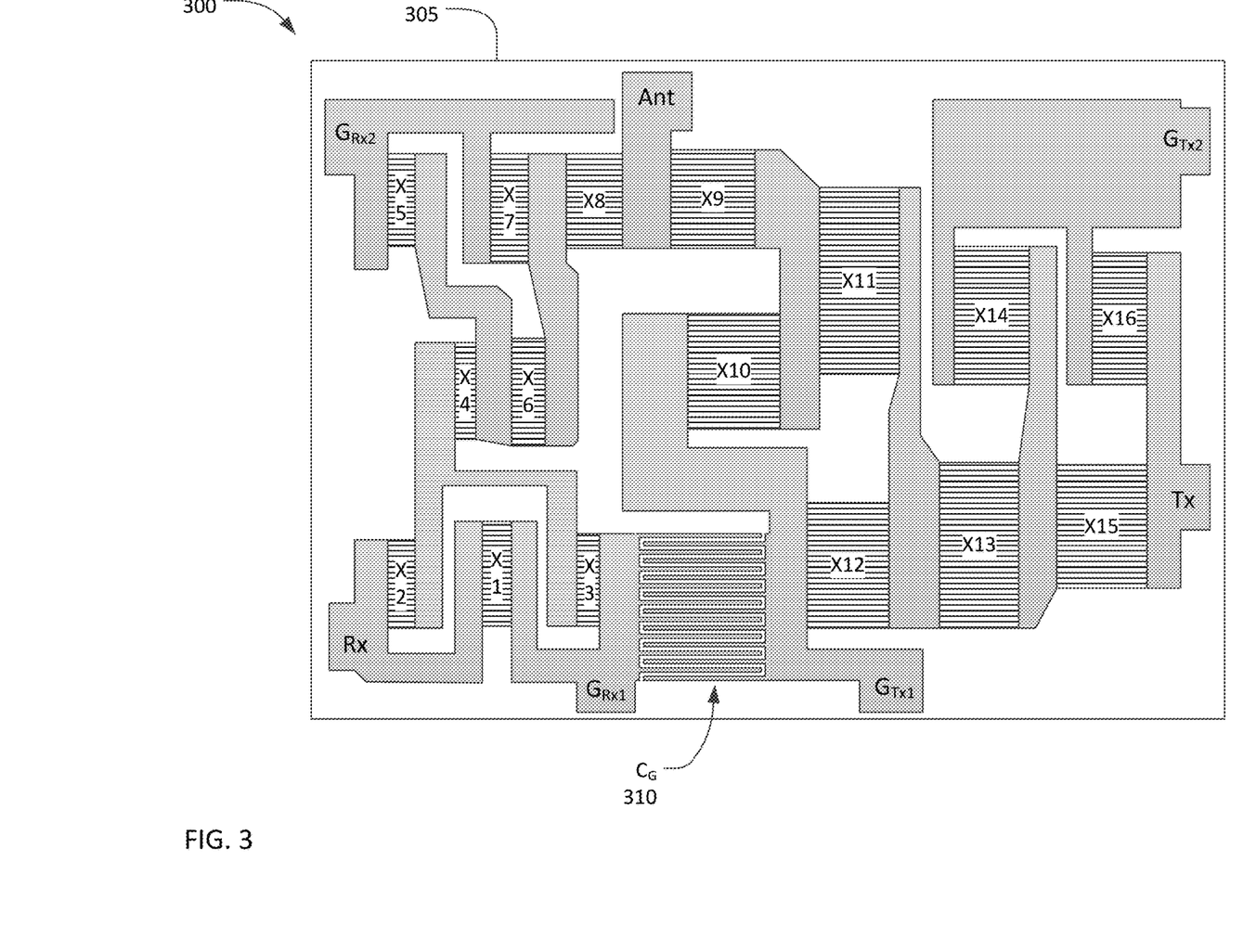
FIG. 3 is a schematic plan view of a physical layout of a chip containing the duplexer device of FIG. 2.
Figure 4:
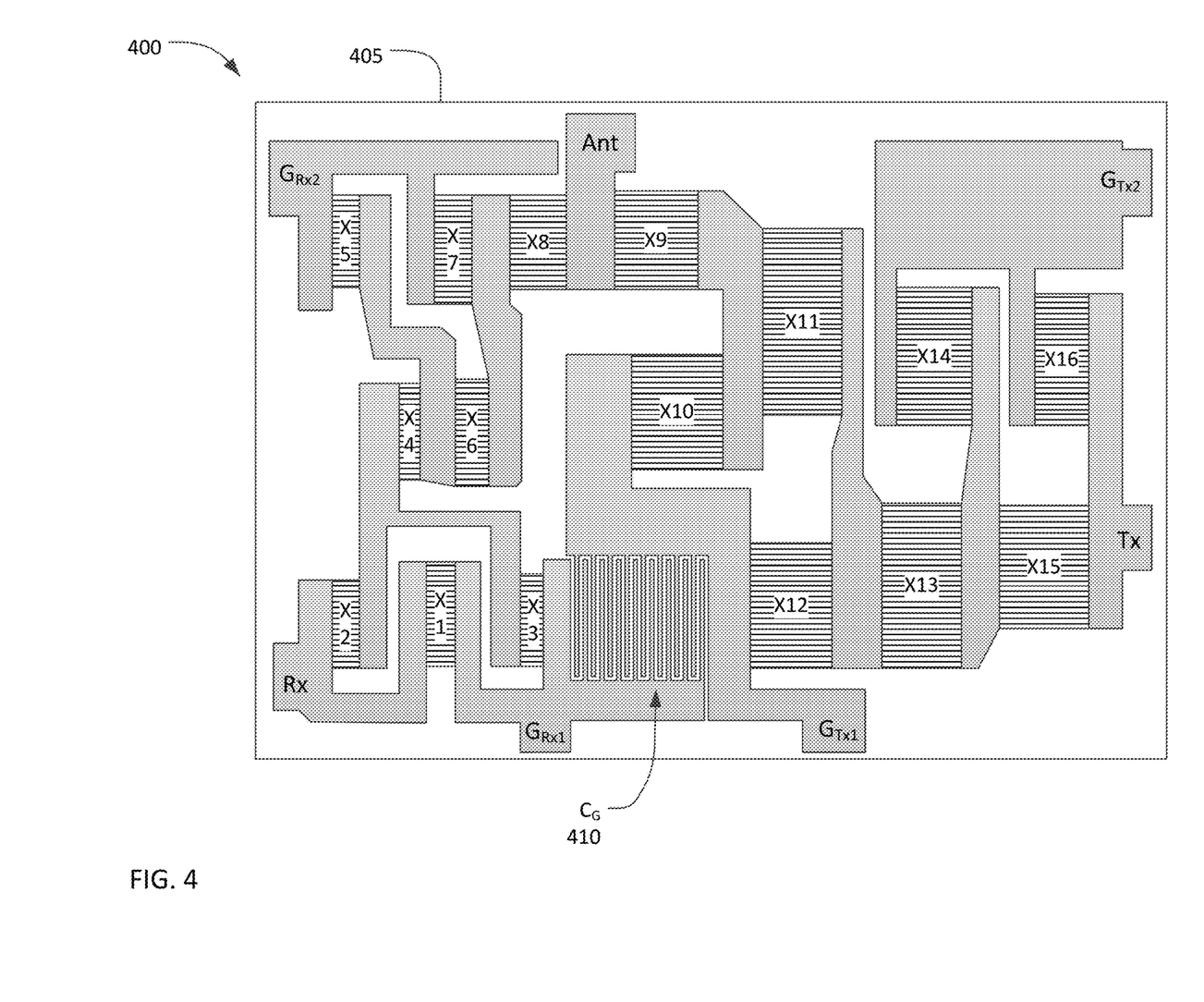
FIG. 4 is a schematic plan view of another physical layout of a chip containing the duplexer device of FIG. 2.

FIG. 3 and FIG. 4 are schematic plan views of two physical layouts of devices 300, 400, respectively, containing duplexers as shown in the schematic circuit diagram of FIG. 2. Each device includes a respective piezoelectric substrate 305, 405. The striped rectangles labeled X1 to X16 are resonators X1 to X16 as shown in FIG. 2. Each resonator X1 to X16 may have a structure similar to the resonator 100 of FIG. 1. The shaded areas are conductors formed on the surface of the substrates to interconnect the resonators. The Labels Tx, Rx, Ant, $G_{Rx1}$, $G_{Rx2}$, $G_{Tx1}$, and $G_{Tx2}$ identify the terminals of the device 300, 400. Each terminal may be a pad, or a portion of a conductor, to be connected to a conductor on a circuit board within a package. Typically, connections between the device terminals and the circuit board are made by means of solder bumps.

Ground coupling capacitors (CG) 310, 410 are connected between a first receive-filter ground terminal $G_{Rx1}$ and a first transmit-filter ground terminal $G_{Tx1}$. The ground coupling capacitors 310, 410 are implemented using interdigital conductors formed on the surface of the piezoelectric substrate. FIG. 3 and FIG. 4 differ only in the orientation of the conductors of the ground coupling capacitors 310, 410.

In FIG. 3, the interdigital conductors of the ground coupling capacitor 310 are parallel to the interdigital conductors of the IDTs of the resonators X1 to X16. In this orientation, the interdigital conductors of the ground coupling capacitor 310 are capable of acting as an IDT to couple acoustic waves to the piezoelectric substrate. The spacing, or pitch, of the conductors of the ground coupling capacitor may be significantly different from the pitch of the IDT conductors such that the frequency range where the ground coupling capacitor can couple acoustic waves to the substrate is removed from the frequency of operation of the duplexer.

In FIG. 4, the interdigital conductors of the ground coupling capacitor 410 are orthogonal to the interdigital conductors of the IDTs of the resonators X1 to X16. In this orientation, the electromechanical coupling between the interdigital conductors of the ground coupling capacitor 410 and the piezoelectric substrate is very weak. Any acoustic waves coupled to the substrate will be primarily confined to the area under the ground coupling capacitor.

Other orientations of the interdigital conductors of the ground coupling capacitor may be used. For example, the interdigital conductors of a ground coupling capacitor may be at an oblique angle (i.e. neither parallel or orthogonal) with respect the conductors of the IDTs of the resonators. Alternatively, the interdigital conductors of a ground coupling capacitor may be curved or serpentine in shape such that an angle between the interdigital conductors of the ground coupling capacitor and the conductors of the resonator IDTs varies over the area of the capacitor.

Figure 5:
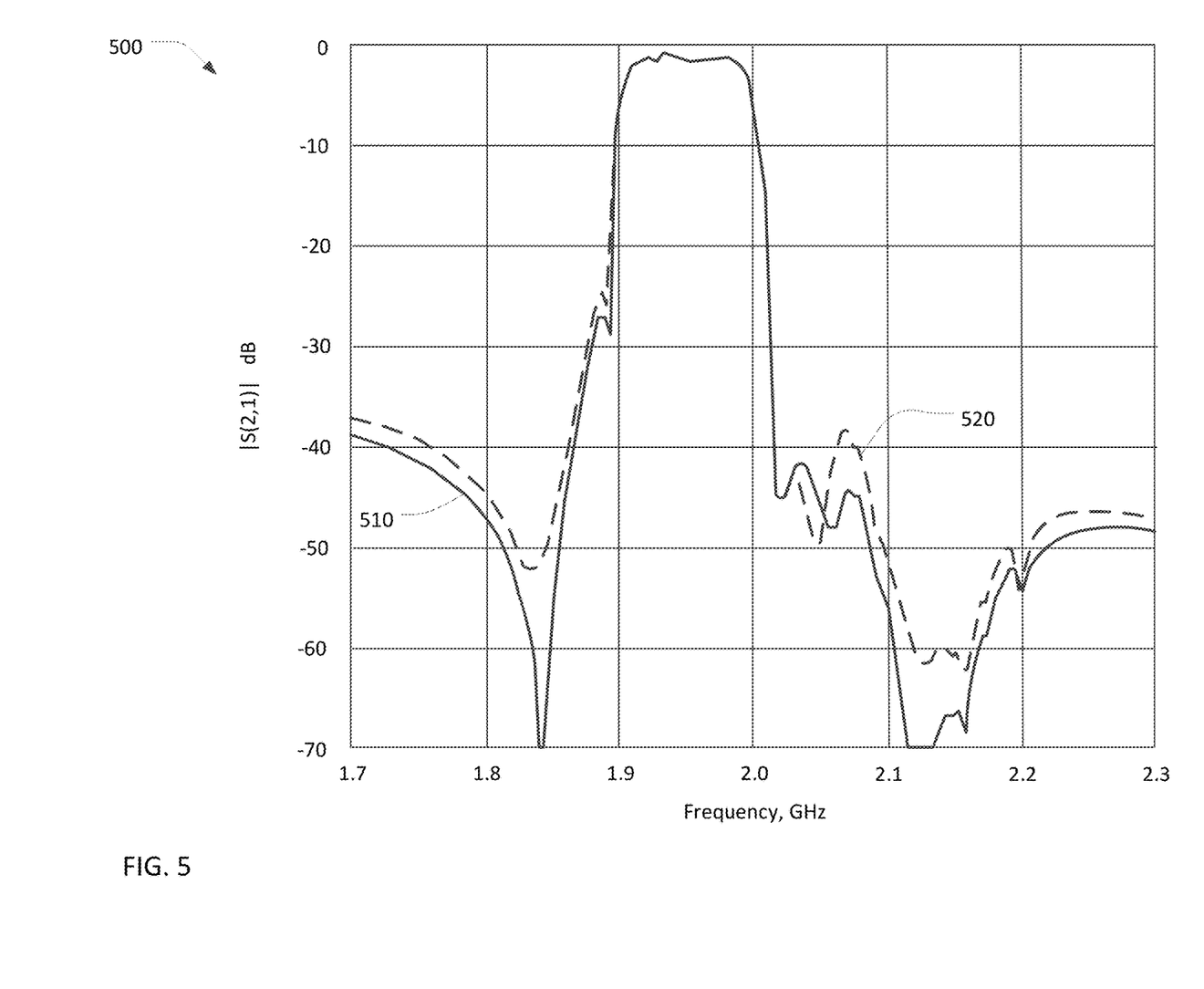
FIG. 5 is a graph comparing the transmission of the transmit filter of the duplexer device of FIG. 2 as a function of frequency with and without a ground coupling capacitor.
Figure 6:
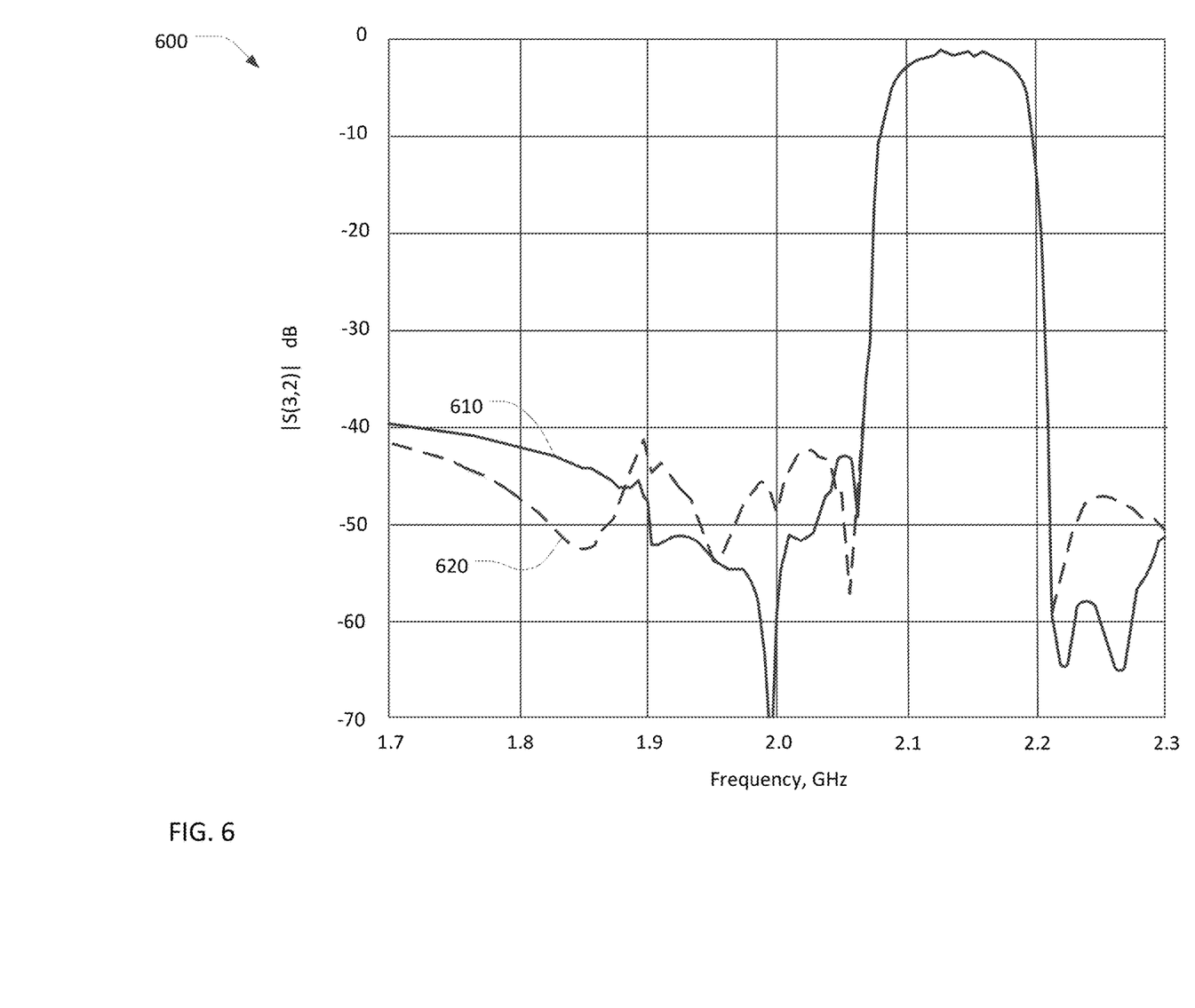
FIG. 6 is a graph comparing the transmission of the receive filter of the duplexer device of FIG. 2 as a function of frequency with and without a ground coupling capacitor.
Figure 7:
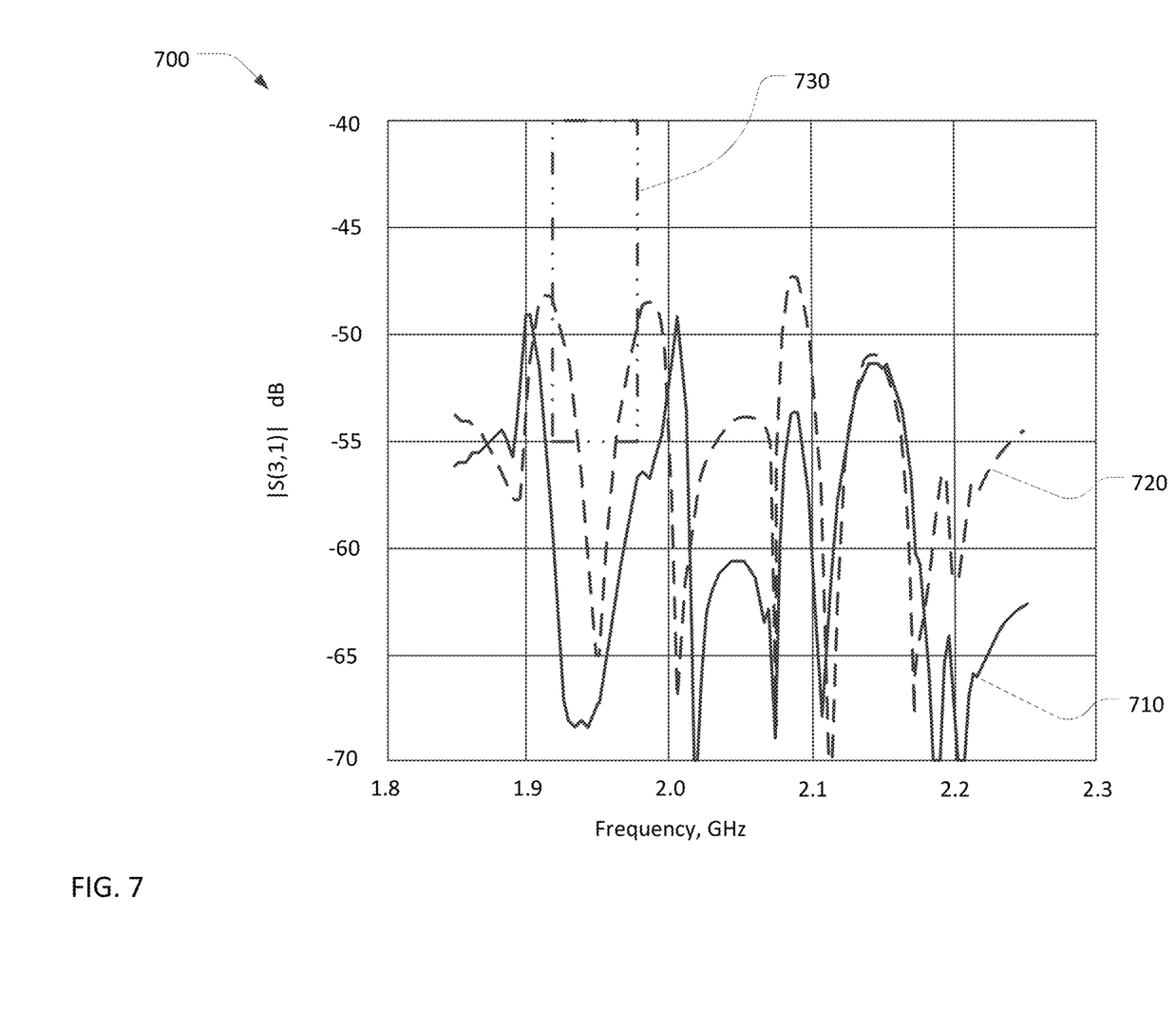
FIG. 7 is a graph comparing the transmission from the transmit terminal to the receive terminal of the duplexer device of FIG. 2 as a function of frequency with and without a ground coupling capacitor.

FIG. 5, FIG. 6, and FIG. 7 are graphs (500, 600, 700, respectively) showing the performance of the duplexer 200 with and without a ground coupling capacitor CG connected between a first receive-filter ground terminal and a first transmit-filter ground terminal. All of the graphs are based on simulation of the duplexer 200 rather than measured data. In all graphs, the solid lines 510, 610, 710 are plots of the performance with CG and the dashed lines 520, 620, 720 are plots of the performance without CG. The duplexer 200 is designed for use in a cellular communications device operating in LTE band 1. The transmit, or uplink, frequency band is 1920 MHz to 1980 MHz, and the receive (downlink) frequency band is 2110 MHz to 2170 MHz.

FIG. 5 is a graph of S(2,1) versus frequency, where S(2,1) is the transmission between the Tx and Ant terminals of the duplexer. FIG. 6 is a graph of S(3,2) versus frequency, where S(3,2) is the transmission between the Ant and Rx terminals of the duplexer. FIG. 7 is a graph of S(3,1) versus frequency, where S(3,1) is the transmission between the Tx and Rx terminals of the duplexer. Note that, in FIG. 5 and FIG. 6, the presence or absence of the ground coupling capacitor CG has no effect of the performance of the transmit and receive filters in their respective passbands. In FIG. 7, the isolation between the Tx and RX terminals over the transmit band from 1920 MHz to 1980 MHz (indicated by the dash-dot-dot line 730) is greatly improved when the ground coupling capacitor CG is present. Specifically, the transmission between the Tx and Rx terminals is less than −57 dB over the transmit band when the ground coupling capacitor CG is present, and as high as −49 dB within the transmit band when the ground coupling capacitor CG is not present.

It is claimed:

1. A duplexer, comprising:
   a surface acoustic wave (SAW) device comprising:
   a piezoelectric substrate;
   a transmit filter comprising a first plurality of SAW resonators formed on a surface of the piezoelectric substrate, the first plurality of SAW resonators including a first transmit shunt resonator connected to a first transmit-filter ground terminal;
   a receive filter comprising a second plurality of SAW resonators formed on the surface of the piezoelectric substrate, the second plurality of SAW resonators including a first receive shunt resonator connected to a first receive-filter ground terminal; and
   a ground coupling capacitor formed on the surface of the piezoelectric substrate and directly connected between the first transmit-filter ground terminal and the first receive-filter ground terminal.

2. The duplexer of claim 1, wherein
   the transmit filter has an input connected to a transmitter terminal and an output connected to an antenna terminal,
   the receive filter has an input connected to the antenna terminal and an output connected to a receiver terminal, and
   the ground coupling capacitor is configured to improve isolation between the transmitter terminal and the receiver terminal for at least a portion of a transmit frequency band and/or a receive frequency band.

3. The duplexer of claim 1, wherein the ground coupling capacitor comprises a plurality of interdigital conductors formed on the surface of the piezoelectric substrate.

4. The duplexer of claim 3, wherein the interdigital conductors of the ground coupling capacitor are parallel to interdigital conductors of the first and second pluralities of SAW resonators.

5. The duplexer of claim 3, wherein the interdigital conductors of the ground coupling capacitor are orthogonal to interdigital conductors of the first and second pluralities of SAW resonators.

6. The duplexer of claim 1, wherein the first plurality of SAW resonators includes a second transmit shunt resonator connected to the first transmit-filter ground terminal.

7. The duplexer of claim 1, wherein the first plurality of SAW resonators includes one or more additional transmit shunt resonators connected to one or more additional transmit-filter ground terminals isolated from the first transmit-filter ground terminal.

8. The duplexer of claim 1, wherein the second plurality of SAW resonators includes a second receive shunt resonator connected to the first receive-filter ground terminal.

9. The duplexer of claim 1, wherein the second plurality of SAW resonators includes one or more additional receive shunt resonators connected to one or more additional receive-filter ground terminals isolated from the first receive-filter ground terminal.

10. The duplexer of claim 1, further comprising:
a package including a circuit board,
wherein the first transmit-filter ground terminal and the first receive-filter ground terminal connect to a system ground plane via conductors of the circuit board.

11. The duplexer of claim 10, wherein
interconnections between the SAW device and the system ground plane via the conductors of the circuit board act as a respective ground inductance between the system ground plane and each receive-filter ground terminal and each transmit-filter ground terminal.

\* \* \* \* \*